(12) United States Patent  
Tang et al.

(10) Patent No.: US 7,920,389 B2
(45) Date of Patent: Apr. 5, 2011

(54) BOARD HARDWARE DEVICE AND RADIO FREQUENCY BLIND-MATE CONNECTION DEVICE

(75) Inventors: Chenggang Tang, Shenzhen (CN); Hao Li, Shenzhen (CN); Haitao Li, Shenzhen (CN); Xiaohui Shen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 12/630,464

(22) Filed: Dec. 3, 2009

(65) Prior Publication Data

US 2010/0073896 A1    Mar. 25, 2010

Related U.S. Application Data

(63) Continuation of application No. PCT/CN2008/070948, filed on May 13, 2008.

(30) Foreign Application Priority Data

Jun. 6, 2007 (CN) .......................... 2007 1 0028455

(51) Int. Cl.
*H05K 1/11* (2006.01)
(52) U.S. Cl. ........................................ 361/803; 361/760
(58) Field of Classification Search .................. 361/803, 361/760, 752, 724; 439/247, 65
See application file for complete search history.

(56) References Cited

U.S. PATENT DOCUMENTS

| 5,966,648 | A | 10/1999 | Ortberg et al. |
| 2003/0045260 | A1 | 3/2003 | Harris |
| 2005/0208912 | A1* | 9/2005 | Kapoor et al. ............... 455/130 |
| 2006/0258209 | A1 | 11/2006 | Hall |
| 2007/0077967 | A1* | 4/2007 | Nicholls et al. .............. 455/561 |
| 2007/0268845 | A1* | 11/2007 | Martinez ...................... 370/278 |
| 2009/0068870 | A1* | 3/2009 | Mezhinsky .................... 439/247 |
| 2010/0027941 | A1* | 2/2010 | Stewart et al. .................. 385/57 |

FOREIGN PATENT DOCUMENTS

| CN | 2482238 Y | 3/2002 |
| CN | 1535056 A | 10/2004 |
| CN | 1536774 A | 10/2004 |
| CN | 1627848 A | 6/2005 |
| CN | 2704945 Y | 6/2005 |
| CN | 101106235 A | 1/2008 |
| WO | WO 2004/100316 A2 | 11/2004 |

* cited by examiner

*Primary Examiner* — Yuriy Semenenko
(74) *Attorney, Agent, or Firm* — Leydig, Voit & Mayer, Ltd.

(57) ABSTRACT

An RF blind-mate connection device disclosed herein includes a duplexer, a power amplification circuit board, a transceiver, an RF signal connector, and a power connector. The duplexer and the transceiver are located at one end of the RF blind-mate connection device, and the transceiver is fixed on the duplexer; the power amplification circuit board is located at the other end of the RF blind-mate connection device, and the location of the power amplification circuit board corresponds to that of the duplexer; the RF signal connector is fixed on the duplexer and the power amplification circuit board; the power connector is fixed on the transceiver and the power amplification circuit board; and the RF signal connector and the power connector transmit both the power signal and the RF signal in a blind-mate way. A board hardware device is disclosed herein to transmit RF signals and power signals inside the RF module through the connector.

8 Claims, 2 Drawing Sheets

BOARD HARDWARE DEVICE AND RADIO FREQUENCY BLIND-MATE CONNECTION DEVICE

CROSS-REFERENCE TO RELATED APPLICATIONS

This application is a continuation of International Patent Application No. PCT/CN2008/070948, filed May 13, 2008, which claims priority to Chinese Patent Application No. 200710028455.4, filed Jun. 6, 2007, both of which are hereby incorporated by reference in their entireties.

FIELD OF THE INVENTION

The present disclosure relates to communication equipments, and in particular, to a board hardware device and a Radio Frequency (RF) blind-mate connection device.

BACKGROUND

In order to accomplish interconnection between units in the RF module, different types of blind-mate connectors are generally selected. Nowadays, the trend of installing and connecting RF modules efficiently is: In the scenarios of complete interconnection, partial interconnection, and initial interconnection between units, good electrical performance is maintained, fewer cables are required, the internal connection of the RF module is more reliable, and the space of RF assembly is less.

FIG. 1 shows an RF connection device that uses a unitary medium and a small signal RF connector in the RF module in the conventional art. The RF connection device is adapted to transmit RF signals inside the RF module. The RF coax connector series are connectors 103, which adopt a blind-mate technology to transmit RF signals between the power amplification circuit board 101 and the digital loop board 102. With the single type of RF signal connectors being deployed in the RF module, blind-mate connection of power supply is impossible. The power signals are still transmitted through cables, and manual operation space still needs to be reserved. Consequently, no more compactness of the RF module can be accomplished.

FIG. 2 shows a connection device that uses a unitary digital-analog hybrid digital blind-mate connector in the RF module in the conventional art. The same connector transmits both power signals and RF signals. The RF connector is a digital-analog hybrid connector 202, which uses a blind-mate technology to transmit both the power signal and the RF signal between the power amplification circuit board 201 and the transceiver circuit board 203. RF signals are vulnerable to external interference, and are transmitted through a single channel. Such a blind-mate solution requires special customized blind-mate connectors, and a digital-analog hybrid digital blind-mate connector needs to be designed according to the requirement of transmitting both the power signal and the RF signal. Generally, a connector is designed to transmit multiple channels of RF signals and power signals (for example, five channels of RF signals and power signals) simultaneously. The designed connector is submitted to the manufacturer for molding and customized production. At the next time, for the connector that needs to transmit six channels of RF signals and power signals, the previously designed connector is no more applicable, and it is necessary to design a connector that can transmit six channels of RF signals and power signals simultaneously, and then submit the design to the manufacturer for molding and customized production. In this way, the development cost is very high.

SUMMARY

In order to overcome the defects in the conventional art, the embodiments of the present invention provide a board hardware device and an RF blind-mate connection device. With the RF blind-mate connection device, the RF signals and power signals in the RF module are transmitted through an RF connector and a power connector respectively.

Therefore, the embodiments of the present invention provide an RF blind-mate connection device, which includes a duplexer, a power amplification circuit board, a transceiver, an RF signal connector, and a power connector.

The duplexer and the transceiver are located at one end of the RF blind-mate connection device, and the transceiver is fixed on the duplexer.

The power amplification circuit board is located at the other end of the RF blind-mate connection device, and the location of the power amplification circuit board corresponds to that of the duplexer.

The RF signal connector is fixed on the duplexer and the power amplification circuit board.

The power connector is fixed on the transceiver and the power amplification circuit board.

The RF signal connector and the power connector transmit both the power signal and the RF signal in a blind-mate way.

A board hardware device is disclosed in an embodiment of the present invention. The device includes a board hardware body and an RF blind-mate connection device which connects the board hardware bodies. The RF blind-mate connection device includes a duplexer, a power amplification circuit board, a transceiver, an RF signal connector, and a power connector.

The duplexer and the transceiver are located at one end of the RF blind-mate connection device, and the transceiver is fixed on the duplexer.

The power amplification circuit board is located at the other end of the RF blind-mate connection device, and the location of the power amplification circuit board corresponds to that of the duplexer.

The RF signal connector is fixed on the duplexer and the power amplification circuit board.

The power connector is fixed on the transceiver and the power amplification circuit board.

The RF signal connector and the power connector transmit both the power signal and the RF signal in a blind-mate way.

In the embodiments of the present invention, the RF connection device uses both an RF connector and a power connector to transmit the RF signals and power signals in the RF module, thus improving the reliability of transmitting signals in the RF module; and multiple ordinary detachable connectors are adapted to transmit multiple channels of RF signals and power signals, and the RF connector and the power connector are applied simultaneously, thus reducing the dimensions of the RF module and reducing the cost.

DETAILED DESCRIPTION

The embodiments of the present invention provide an RF blind-mate connection device. The RF blind-mate connection device includes a duplexer, a power amplification circuit board, a transceiver, an RF signal connector, and a power signal connector. The two ends of the RF signal connector and the power signal connector are located on the power amplification circuit boards of the upper frame and the lower frame of the duplexer or transceiver respectively. Power signals and multiple channels of RF signals are transmitted between connectors in a blind-mate way. Such an RF blind-mate connection device can be implemented through multiple RF signal connectors, power connectors, and ordinary connectors capable of transmitting both the power signal and the RF signal simultaneously, thus reducing the cost.

The preferred embodiments of the present invention are elaborated below with reference to accompanying drawings.

Figure 1:
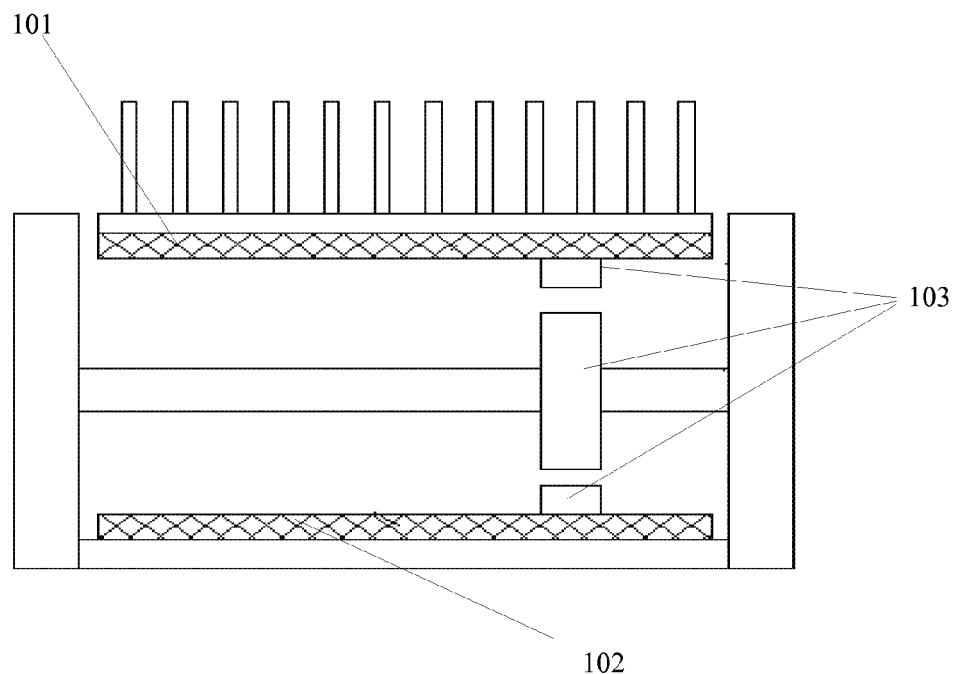
FIG. 1 is an RF connection device that uses a unitary medium and small signal RF connector in the conventional art.
Figure 2:
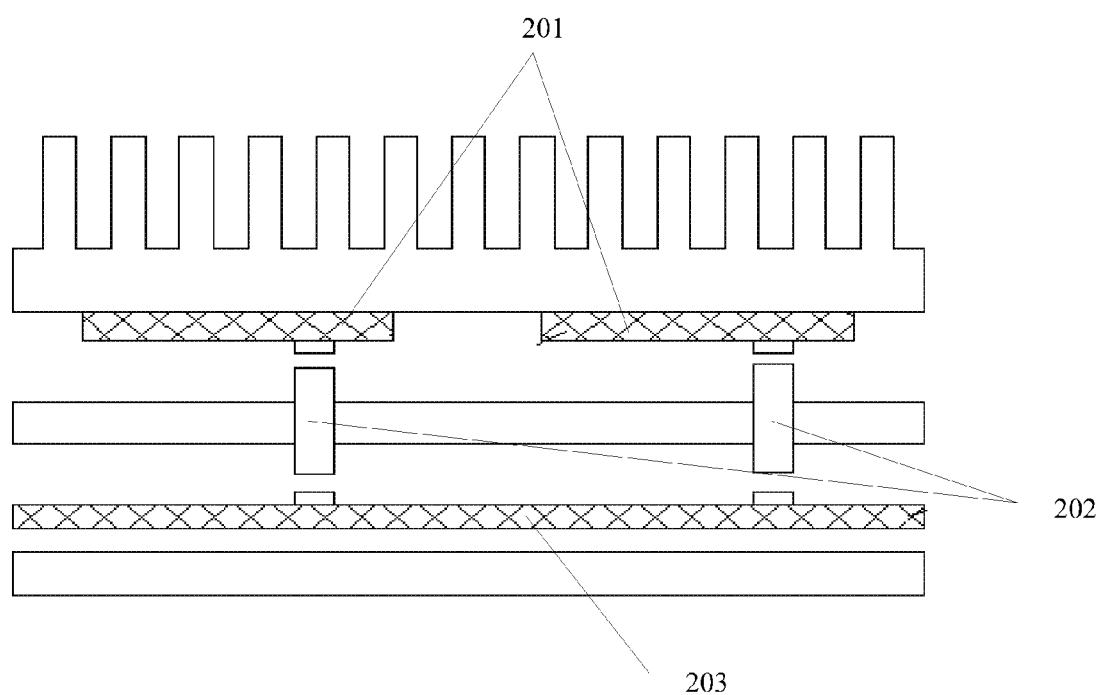
FIG. 2 is an RF blind-mate connection device that uses a digital-analog hybrid digital blind-mate connector in the conventional art.
Figure 3:
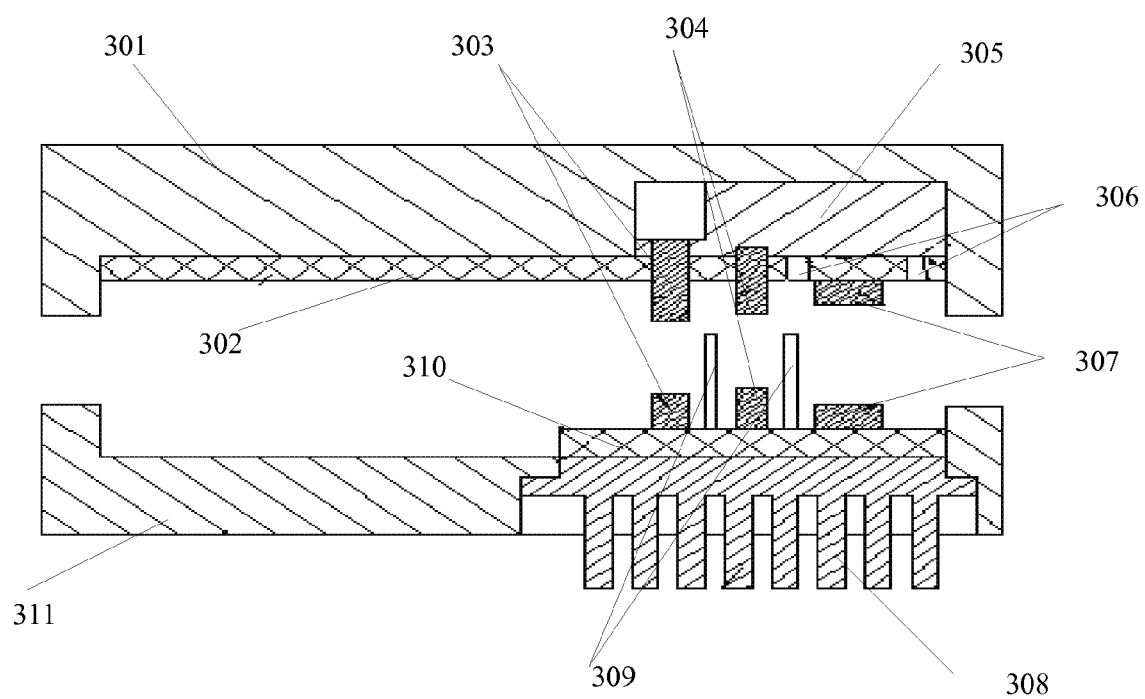
FIG. 3 shows a structure of an RF blind-mate connection device according to an embodiment of the present invention.

FIG. 3 shows an RF blind-mate connection device according to an embodiment of the present invention. The RF blind-mate connection device includes a duplexer 305, a transceiver 302, a power amplification circuit board 310, and a blind-mate connector for transmitting signals between the upper frame and the lower frame (for example, connector 303, connector 304, and connector 307 shown in FIG. 3). FIG. 3 also shows the upper frame 301 and the lower frame 311 that carry the RF blind-mate connection device, and a profiled heat sink 308 in the frame.

The duplexer 305 is fixed on the top of the upper frame 301. The transceiver 302 is located under the duplexer 305, and is fixed to the duplexer 305 through two short pins 306. The profiled heat sink 308 is located at the bottom of the lower frame 311. The power amplification circuit board 310 is fixed onto the profiled heat sink 308. Two long pins 309 are adapted to fix the relative position relationship between the power amplification circuit board 310 and the duplexer 305.

The types of the blind-mate connectors include: power connector 307, RF signal connector 304, and connector 303 capable of transmitting the power signal and the RF signal simultaneously. Such connectors implement blind-mate connection for transmitting power signals and RF signals between the duplexer 305, the transceiver 302, and the power amplification circuit board 310. Of the connectors 303 capable of transmitting both the power signal and the RF signal simultaneously, the male connector is fixed onto the duplexer 305, and the female connector is welded onto the power amplification circuit board 310, and fixed onto the power amplifier substrate through screws. The power connector 307 is welded onto the transceiver 302 and the power amplification circuit board 310 respectively to transmit power signals and control signals. Of the RF signal connectors 304, the male connector is fixed onto the duplexer 305 through screws, and the female connector is welded onto the power amplification circuit board 310 to transmit large-power RF signals. In this way, different blind-mate connectors are selected according to the requirements inside the RF module. For example, when an electric current needs to be transmitted, the power connector 307 is selected; when RF signals need to be transmitted, the RF signal connector 304 is selected; if both the power signal and the RF signal need to be transmitted simultaneously, the connector 303 capable of transmitting both power signals and RF signals is selected, or the power connector 307 and the RF signal connector 304 are selected simultaneously.

In the specific implementation process, according to the requirements of transmitting multiple channels of RF signals and power signals, multiple RF signal connectors 304 may be installed in the frame to transmit RF signals and power signals. For example, if five channels of RF signals and power signals need to be transmitted, only an RF connector 304 capable of transmitting five channels of RF signals simultaneously and a power connector 307 need to be installed. The RF signals and power signals are transmitted according to different requirements. It is not necessary to customize connectors, and the connectors can be detached and fitted together quickly to optimize the transmission.

The upper box 301 and the lower box 302 in FIG. 3 are bound through sealing material, and the interior is completely sealed to prevent water and adapt to massive outdoor application. At the time of installing the RF blind-mate connection device, the cover of the upper box and the lower box can be closed directly to accomplish connection, without the need of reserving the cabling space. The product is lighter, the box requires fewer materials, and thus the box is lighter. The enclosure with the blind-mate connector can shield the signals in the conductor in the connector from the external interference signals.

In conclusion, the RF blind-mate connection device under the present invention enables blind-mate connection of both power signals and RF signals according to the need of transmitting multiple channels of RF signals and power signals when the connector is an ordinary blind-mate connector, thus improving the reliability of the internal connection of the RF module, reducing the operation space required for installing the RF module, and reducing the size and cost of the RF module.

Although the invention has been described through several exemplary embodiments, the invention is not limited to such embodiments. It is apparent that those skilled in the art can make modifications and variations to the invention without departing from the spirit and scope of the invention. The invention is intended to cover the modifications and variations provided that they fall in the scope of protection defined by the following claims or their equivalents.

What is claimed is:

1. A Radio Frequency (RF) blind-mate connection device, comprising: a duplexer, a power amplification circuit board, a transceiver, an RF signal connector, and a power connector, and the RF signal connector comprises a male connector and a female connector, wherein:
   the duplexer and the transceiver are located at one end of the RF blind-mate connection device, and the transceiver is fixed on the duplexer;
   the power amplification circuit board is located at the other end of the RF blind-mate connection device, and the location of the power amplification circuit board corresponds to that of the duplexer;
   the male connector of the RF signal connector is fixed on the duplexer and the female connector of the RF signal connector is fixed on the power amplification circuit board;
   the power connector is fixed on the transceiver and the power amplification circuit board; and
   the RF signal connector and the power connector transmit both the power signal and the RF signal in a blind-mate way.

2. The RF blind-mate connection device of claim 1, further comprising a connector being able to transmit both the power signal and the RF signal simultaneously, and the connector comprises a male connector and a female connector, wherein the male connector of the connector is mounted to the duplexer, and the female connector of the connector is mounted to the power amplification circuit board.

3. The RF blind-mate connection device of claim 1, wherein the transceiver is fixed to the duplexer through two short pins.

4. The RF blind-mate connection device of claim 1, wherein two long pins are adapted to fix the relative position relationship between the power amplification circuit board and the duplexer.

5. A board hardware device, comprising a board hardware body and a Radio Frequency (RF) blind-mate connection device which connects the board hardware bodies, the RF blind-mate connection device comprises: a duplexer, a power amplification circuit board, a transceiver, an RF signal connector, and a power connector, and the RF signal connector comprises a male connector and a female connector, wherein:

the duplexer and the transceiver are located at one end of the RF blind-mate connection device, and the transceiver is fixed on the duplexer;

the power amplification circuit board is located at the other end of the RF blind-mate connection device, and the location of the power amplification circuit board corresponds to that of the duplexer;

the male connector of the RF signal connector is fixed on the duplexer and the female connector of the RF signal connector is fixed on the power amplification circuit board;

the power connector is fixed on the transceiver and the power amplification circuit board; and the RF signal connector and the power connector transmit both the power signal and the RF signal in a blind-mate way.

6. The board hardware device of claim 5, wherein the Radio Frequency (RF) blind-mate connection device further comprises a connector being able to transmit both the power signal and the RF signal simultaneously, and the connector comprises a male connector and a female connector, wherein the male connector of the connector is mounted to the duplexer, and the female connector of the connector is mounted to the power amplification circuit board.

7. The board hardware device of claim 5, wherein the transceiver is fixed to the duplexer through two short pins.

8. The board hardware device of claim 5, wherein two long pins are adapted to fix the relative position relationship between the power amplification circuit board and the duplexer.

* * * * *